United States Patent
Byun et al.

(10) Patent No.: US 7,033,945 B2
(45) Date of Patent: Apr. 25, 2006

(54) GAP FILLING WITH A COMPOSITE LAYER

(75) Inventors: Jeong Soo Byun, Cupertino, CA (US);
Zheng Yuan, Fremont, CA (US);
Shankar Venkataraman, Santa Clara, CA (US); M. Ziaul Karim, San Jose, CA (US); Thanh N. Pham, San Jose, CA (US); Ellie Y. Yieh, San Jose, CA (US)

(73) Assignee: Applied Materials, Santa Clara, CA (US)

( * ) Notice: Subject to any disclaimer, the term of this patent is extended or adjusted under 35 U.S.C. 154(b) by 0 days.

(21) Appl. No.: 10/857,829

(22) Filed: Jun. 1, 2004

(65) Prior Publication Data
US 2005/0277257 A1    Dec. 15, 2005

(51) Int. Cl.
*H01L 21/311*    (2006.01)

(52) U.S. Cl. ...................... 438/700; 438/680
(58) Field of Classification Search ............... 438/700, 438/680, 681, 692, 663, 723, 724, 756, 757
See application file for complete search history.

(56) References Cited

U.S. PATENT DOCUMENTS

| | | | | |
|---|---|---|---|---|
| 5,981,402 A | * | 11/1999 | Hsiao et al. | 438/756 |
| 6,030,881 A | * | 2/2000 | Papasouliotis et al. | 438/424 |
| 6,037,018 A | * | 3/2000 | Jang et al. | 427/579 |
| 6,191,004 B1 | * | 2/2001 | Hsiao | 438/435 |
| 6,429,136 B1 | * | 8/2002 | Miwa | 438/692 |
| 6,653,204 B1 | | 11/2003 | Wu et al. | |
| 6,794,290 B1 | * | 9/2004 | Papasouliotis et al. | 438/694 |
| 6,802,944 B1 | * | 10/2004 | Ahmad et al. | 204/192.23 |
| 6,808,748 B1 | * | 10/2004 | Kapoor et al. | 427/255.31 |
| 6,812,153 B1 | * | 11/2004 | Hua et al. | 438/706 |
| 6,908,862 B1 | * | 6/2005 | Li et al. | 438/700 |

* cited by examiner

*Primary Examiner*—David Nhu
(74) *Attorney, Agent, or Firm*—Townsend Townsend Crew, LLP

(57) ABSTRACT

A method of filling a gap formed between adjacent raised surfaces on a substrate. In one embodiment the method comprises depositing a boron-doped silica glass (BSG) layer over the substrate to partially fill the gap using a thermal CVD process; exposing the BSG layer to a steam ambient at a temperature above the BSG layer's Eutectic temperature; removing an upper portion of the BSG layer by exposing the layer to a fluorine-containing etchant; and depositing an undoped silica glass (USG) layer over the BSG layer to fill the remainder of the gap.

17 Claims, 3 Drawing Sheets

Substrate with
STI pattern

BSG deposition
(SACVD)

Annealing in
steam ambient

HF treatment

HDP oxide
deposition

CMP
planarization

GAP FILLING WITH A COMPOSITE LAYER

BACKGROUND OF THE INVENTION

One of the primary steps in the fabrication of modern semiconductor devices is the formation of a thin film on a semiconductor substrate by chemical reaction of gases. Such a deposition process is referred to generally as chemical vapor deposition ("CVD"). Conventional thermal CVD processes supply reactive gases to the substrate surface, where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma.

Any of these CVD techniques may be used to deposit conductive or insulative films during the fabrication of integrated circuits. For applications such as the deposition of insulating films as premetal or intermetal dielectric layers in an integrated circuit or for shallow trench isolation, one important physical property of the CVD film is its ability to fill gaps completely between adjacent structures without leaving voids; this property is referred to as the film's gapfill capability. Gaps that may require filling include spaces between adjacent raised structures such as transistor gates, conductive lines, etched trenches, or the like.

As semiconductor device geometries have decreased in size over the years, the ratio of the height of such gaps to their width, the so-called "aspect ratio," has increased dramatically. Gaps having a combination of high aspect ratio and a small width present a particular challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation such as by trapping undesirable impurities. The semiconductor industry has accordingly been searching aggressively for techniques that may improve gapfill capabilities, particularly with high-aspect-ratio small-width gaps.

One of the more aggressive gapfill applications in modern integrated circuits is isolating adjacent active devices using a process referred to as shallow trench isolation (STI). STI isolation techniques generally etch shallow trenches in the silicon substrate, fill the etched trenches with a dielectric material and then planarize the structure back to the silicon surface in the areas outside the trench. Active devices can then be built in the spaces or islands between the isolation regions.

FIGS. 1A–1F are simplified cross-sectional views of a partially completed integrated circuit illustrating a common STI formation process formed on a silicon substrate 10. Referring to FIG. 1A, a typical shallow trench isolation structure is created by first forming a thin pad oxide layer 12 over the surface of substrate 10 and then forming a silicon nitride layer 14 over pad oxide layer 12. The nitride layer acts as a hard mask during subsequent photolithography processes and the pad oxide layer provides adhesion of the nitride to the silicon substrate and protects the substrate when the nitride layer is removed near the end of the STI formation process.

A series of etch steps are then performed using standard photolithography techniques to pattern the nitride and oxide layers and form trenches or gaps 22 in silicon substrate 10. The photoresist (not shown) is then removed and the structure is subjected to an ion implantation and/or $H_2$ treatment step as shown in FIG. 1B.

Next, a trench lining layer 16, such as an in situ steam generation (ISSG) oxide or other thermal oxide layer is usually formed as shown in FIG. 1C. The formation of lining layer 16 removes etch damage and/or residue from the interior of the trench and passivates the silicon surface of the trench provising a stable interface between the silicon and the trench fill material. The formation of lining layer 16 also rounds the corners of the pad, which may improve device performance as a sharp corner tends to enhance the electric field lines at the corner and degraded MOSFET turn-off characteristics.

Some STI applications form one or more additional lining layers after the formation of oxide layer 16. For example, in FIG. 1D a silicon nitride layer 18 and medium temperature oxide layer 20 are shown. Such lining layers help minimize dopant distribution and minimize the formation of a dent or divot between the silicon substrate and the filled trench as discussed later with respect to FIG. 1F. The material of the additional lining layers may also be selected to improve device performance and minimize silicon bending and other issues.

Referring to FIG. 1E, trenches 22 are then filled with an insulating material, such as gapfill silicon oxide layer 24, using a deposition process that has good gapfill properties. Ideally, the gapfill process completely fills trench 22 so that no air gaps or voids are formed in the trench. Also, it is desirable to minimize physical damage to the trench walls and minimize stress at the silicon/STI structure interface that may occur during the trench fill process.

One or more additional steps including chemical mechanical polishing (CMP) are then used to remove nitride layer 14 and pad oxide layer 12 and level the gapfill oxide 24 to the top of the trench (surface 26) as shown in FIG. 1F. The remaining insulating oxide in the trenches provides electrical isolation between active devices formed on neighboring islands of silicon. During the planarization process, the differing physical properties of the different materials that form the STI structure generally result in the formation of small dents or divots 28 on the surface of the structure at the interface between the silicon substrate and the gapfill dielectric. Minimizing the size of such dents or divots is an important device performance criteria for some integrated circuits.

A variety of different gapfill techniques have been developed to address such situations. Despite the many successes achieved in this area, semiconductor manufacturers are continuously researching alternative techniques to fill such gaps as well as improved techniques to fill the even more aggressive aspect ratio gaps that will likely be required in future processes.

BRIEF SUMMARY OF THE INVENTION

Embodiments of the present invention deposit a composite insulating material that can be used to fill trenches or gaps between adjacent raised features. The techniques of the invention are particularly useful for filling trenches associated with shallow trench isolation structures in integrated circuits but can be used in a variety of other applications including, but not limited to, the formation of premetal and intermetal dielectric layers in integrated circuits.

One embodiment of the method of the invention comprises depositing a boron-doped silica glass (BSG) layer over the substrate to partially fill a gap formed between two adjacent raised surfaces on a substrate; heating the deposited BSG layer above its Eutectic temperature; thereafter, removing an upper portion of the deposited BSG layer; and thereafter, depositing an undoped silica glass (USG) layer over the BSG layer to fill the remainder of the gap.

Another embodiment comprises depositing a boron-doped silica glass (BSG) layer over the substrate to partially fill a gap formed between two adjacent raised surfaces on a substrate using a thermal CVD process; exposing the BSG layer to a steam ambient at a temperature above the BSG layer's Eutectic temperature; removing an upper portion of the BSG layer by exposing the layer to a fluorine-containing etchant; and depositing an undoped silica glass (USG) layer over the BSG layer to fill the remainder of the gap.

These and other embodiments of the invention along with many of its advantages and features are described in more detail in conjunction with the text below and attached figures.

DETAILED DESCRIPTION OF THE INVENTION

Embodiments of the invention fill trenches and/or gaps between adjacent raised features of integrated circuits by depositing a composite insulating material, such as silicon oxide material, into the trenches and/or gaps. The inventors have developed a method of depositing the composite material using a multistep process. In one embodiment the multistep process includes a depositing a first boron-doped silicon oxide layer (also referred to as borosilcate glass or BSG layer) using a thermal CVD technique, heating the deposited BSG layer above its Eutectic temperature and then depositing a second undoped silicon oxide layer (or USG layer) over the BSG layer using a plasma CVD technique. The multistep process can be used to fill the STI trenches in a manner that is superior to using a single layer alone. Embodiments of the invention permit the dielectric material to be deposited with substantially 100% gapfill for integrated circuits having minimum feature sizes of 0.10 µm or less; bottom-up gapfill may be achieved inside very aggressive trenches having aspect ratios greater than 6:1.

Figure 1A:
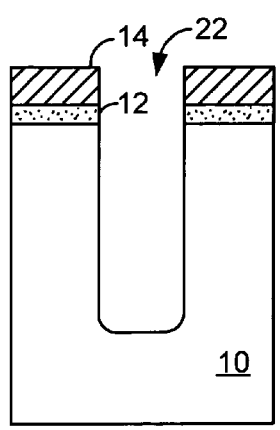
FIGS. 1A–1F are simplified cross-sectional views of a substrate illustrating a previously known shallow trench isolation formation process.
Figure 1B:
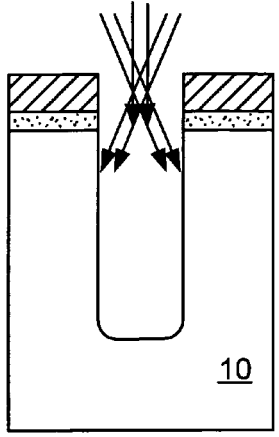
Figure 1C:
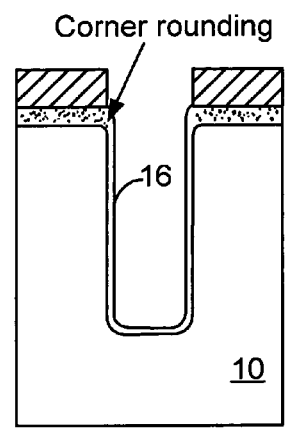
Figure 1D:
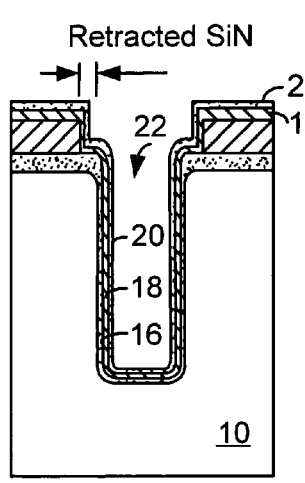
Figure 1E:
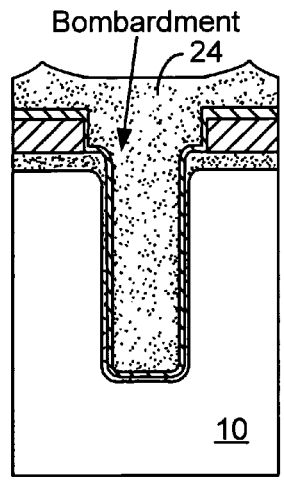
Figure 1F:
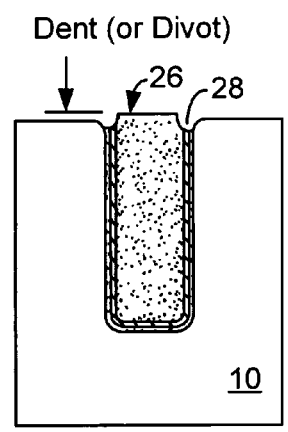
Figure 2:
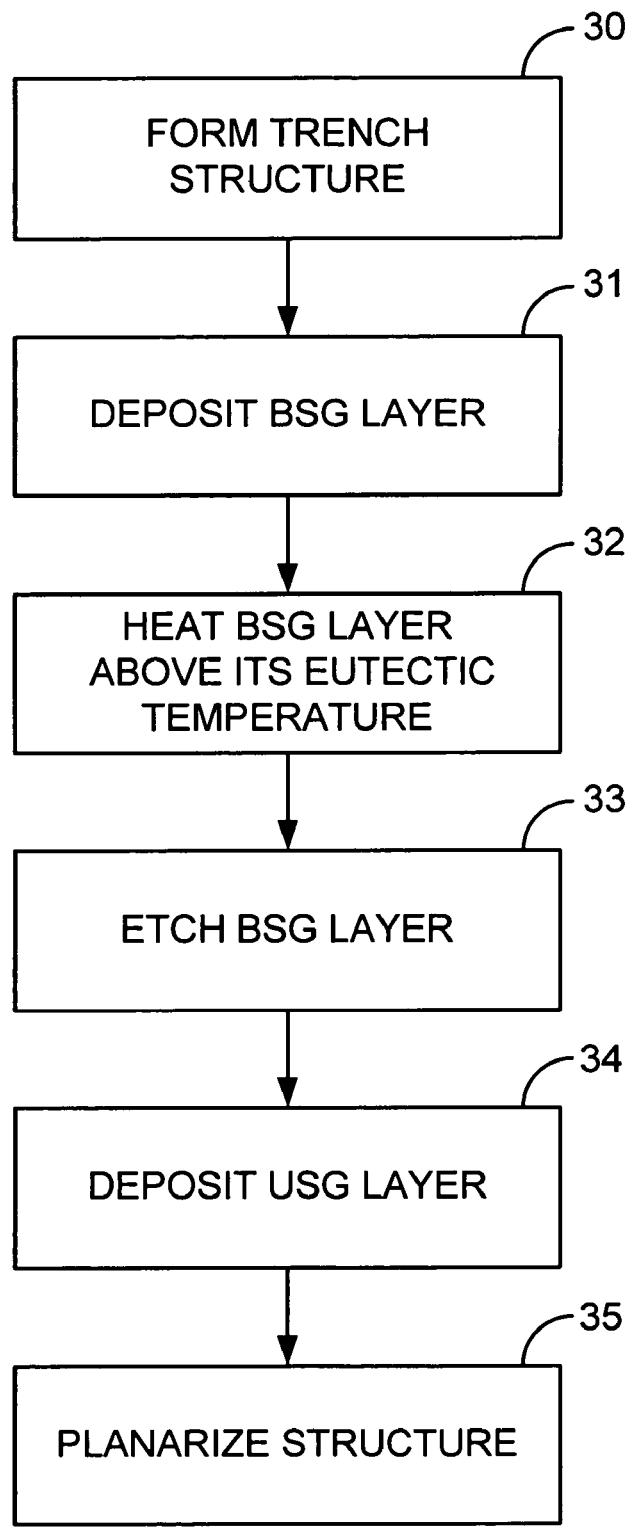
FIG. 2 is a flowchart depicting steps associated with one embodiment of the present invention.

In order to better appreciate and understand the present invention, reference is first made to FIGS. 2 and 3A–3F. FIG. 2 is a flowchart depicting steps associated with one embodiment of the invention as used in a shallow trench isolation (STI) application while FIGS. 3A–3F are simplified cross-sectional views of a substrate processed according to the sequence set forth in FIG. 2. As used herein, the terms "film" and "layer" are intended to refer interchangeably to a thickness of material although in describing embodiments in which a composite material is deposited, the completed structure is sometimes referred to as a layer, with the material deposited in each deposition step referred to as a film comprised by that layer.

Figure 3A:
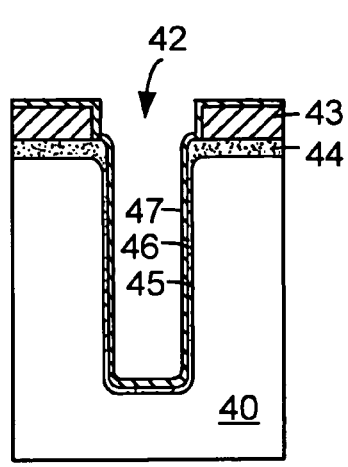
FIGS. 3A–3F are simplified cross-sectional views of a substrate processed according to the sequence set forth in FIG. 2.

As shown in FIG. 2, the process starts by forming appropriate trench structures on a silicon substrate 40 (FIG. 2, step 30 and FIG. 3A). In the embodiment shown in FIG. 3A the trench structure includes a plurality of narrow-width, high-aspect-ratio trenches 42 etched through a silicon nitride layer 43 and silicon oxide layer 44 into substrate 40. Each trench 42 is lined with ISSG layer 45, silicon nitride layer 46 and medium temperature oxide layer 47. It is to be understood that embodiments of the invention are useful in any shallow trench isolation technique regardless of the composition of materials in the raised stacks separated by the trenches and the type of lining layer. Thus, in other embodiments the structure of the trenches may vary from what is shown in FIG. 3A. For example, the trenches may be lined with different, fewer or more layers than is shown in FIG. 3A and/or be formed in different materials. Trench 42 may be formed according to any of many well known techniques.

Figure 3B:
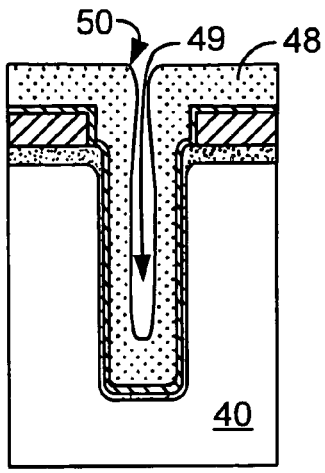
Figure 3C:
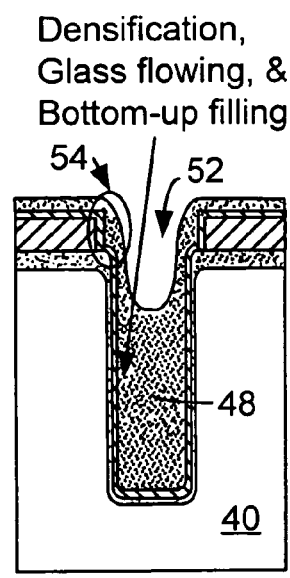

Next, trenches 42 are partially filled with BSG material deposited using a thermal CVD process (FIG. 2, step 31 and FIG. 3B). In one specific embodiment optimized for deposition in a 200 mm Producer chamber manufactured by Applied Materials, the BSG layer is deposited using a subatmospheric CVD (SACVD) technique in a Producer™ chamber manufactured by Applied Materials and outfitted for 200 mm substrates using the gases and parameters set forth in Table 1 below. Other embodiments may use other thermal CVD processes, other gases and/or other parameters providing the BSG layer has excellent gapfill properties and can be reflowed in step 32. In one embodiment the concentration of boron in the BSG layer is between 2.0 to 8.0 weight percent. In another embodiment the concentration of Boron in the BSG layer is between 0.5 and 7.0 weight percent. Within this range, higher boron concentrations generally have better reflow characteristics and the lower concentrations are used when the thermal budget for a particular application is less critical.

TABLE 1

| PARAMETER | VALUE |
| --- | --- |
| TEOS flow | 50–5000 mgm |
| $O_3$ flow (12.5 wt. % in $O_2$) | 5,000–20,000 sccm |
| Temperature | 400–600° C. |
| Pressure | 100–700 torr |
| Manifold Spacing | 100–600 mils |

As shown in FIG. 3b, deposition of the BSG material results in a partial filling of the trenches with BSG layer 48 and the formation of a void 49. In some embodiments deposition of BSG layer 48 is stopped before the upper corners 50 of the BSG material contact each other thereby pinching or closing off void 49. BSG layer 48 is then heated above its glass transition temperature (FIG. 2, step 32 and FIG. 3c) to reflow the layer and create a bottom-up filling profile that replaces void 49 with opening or gap 52. In one embodiment reflow step 32 heats BSG layer 48 in a steam ambient using rapid thermal processing techniques for between 5 seconds and 3 minutes at a temperature between 900–1200° C. Reflowing BSG layer 48 in this manner also beneficially densifies the BSG material. In one embodiment the steam ambient includes oxygen and hydrogen where the ratio of oxygen to hydrogen is between 0.5–2.0:1. In some embodiments the substrate is annealed in a furnace at a temperature between 700–1100° C. for between 10 and 120 minutes. In some embodiments the substrate is annealed in an RTP environment at a temperature between 900–1200° C. for between 5 seconds to 3 minutes.

Figure 3D:
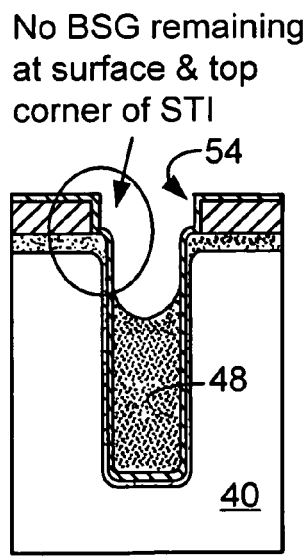

Reflowed BSG layer 48 includes material along the sidewall of opening 52 that covers the upper corner 54 of the STI structure. Embodiments of the invention remove this portion of BSG layer 48 prior to completing the gapfill process (FIG. 2, step 33 and FIG. 3D). In one embodiment this material is removed by dipping the substrate in a bath of hydrofluoric (HF) acid. Other embodiments may remove the BSG material using any appropriate silicon oxide etching process including plasma etching with reactive fluorine species. As shown in FIG. 3D, step 33 removes the portion of layer 48 from area 54 so that the top portion of layer 48 is below the top surface of the silicon substrate upon which layers 44 and 43 are formed.

Figure 3E:
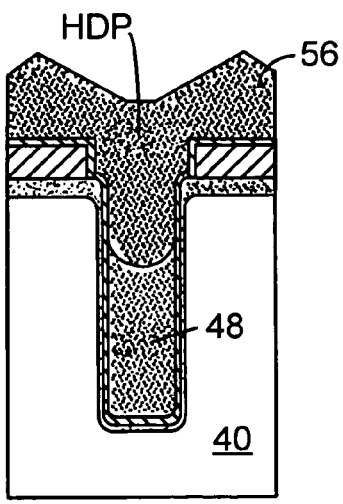

A silicon oxide or similar layer of material 56 is then deposited over the substrate to fill in opening 52 and complete the gapfill process (FIG. 2, step 34 and FIG. 3E). Silicon oxide layer 56 can be deposited using any appropriate technique as is known to those of skill in the art. In some embodiments, however, oxide layer 56 is deposited using high density plasma (HDP-CVD) process that includes simultaneous deposition and sputtering components and employs a process gas comprising silane ($SiH_4$), molecular oxygen ($O_2$) and an optional inert gas, such as helium. In one particular embodiment, HDP oxide layer 56 is deposited in a ULTIMA™ chamber manufactured by Applied Materials and outfitted for 200 mm wafers according to the parameters set forth below in Table 2.

TABLE 2

| PARAMETER | VALUE |
|---|---|
| $SiH_4$ | 39–90 sccm |
| $O_2$ | 45–150 sccm |
| He | 100–400 sccm |
| Temperature | 400–700° C. |
| Pressure | 2–10 mTorr |

Figure 3F:
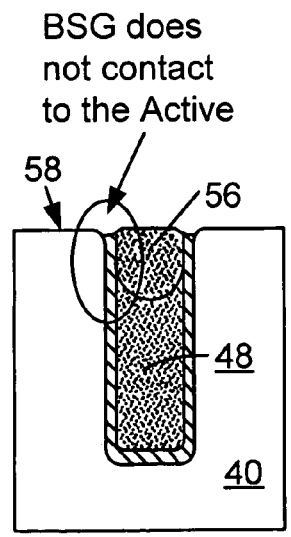

After deposition of silicon oxide layer 56, the substrate is planarized (FIG. 2, step 35) to a substantially planar surface 58 to remove the nitride and pad oxide layers and create the final STI structure as shown in FIG. 3F. Because the final planarized structure does not expose BSG layer 48 to the CMP process and the trench is lined with an appropriate material that does not contain boron, there is no possibility for boron to diffuse from within gap 42 into the silicon substrate. The segregation coefficient of boron is less than 1, meaning that undoped silicon oxide accepts boron; while the segregation coefficient of phosphorus is greater than 1, meaning silicon oxide rejects phosphorus. Also, the diffusivity of boron in silicon oxide is very low (approximately four orders of magnitude lower than that of $H_2O$ in $SiO_2$).

The description above has been given to help illustrate the principles of this invention. It is not intended to limit the scope of this invention in any way. A large variety of variants are apparent, which are encompassed within the scope of this invention. While the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A method of filling a gap formed between adjacent raised surfaces on a substrate, the method comprising:
   depositing a boron-doped silica glass (BSG) layer over the substrate to partially fill the gap;
   heating the deposited BSG layer above its Eutectic temperature;
   thereafter, removing an upper portion of the BSG layer; and
   depositing an undoped silica glass (USG) layer over the BSG layer to fill a remainder of the gap.

2. The method of claim 1 wherein the gap is a trench formed on a silicon substrate as part of a shallow trench isolation (STI) process.

3. The method of claim 1 wherein the BSG layer and USG layer combine to fill the gap without forming a void.

4. The method of claim 1 wherein a concentration of boron in the BSG layer is between 0.5 to 7.0 weight percent.

5. The method of claim 4 wherein the BSG layer is deposited by reacting a silicon precursor with an oxidizing agent.

6. The method of claim 5 wherein the silicon precursor is either TEOS or $SiH_4$ and the oxidizing agent comprises one or more of ozone and molecular oxygen.

7. The method of claim 5 wherein the BSG layer is deposited by an SACVD deposition process.

8. The method of claim 1 wherein the BSG layer is heated above its glass transition temperature in an steam ambient having a ratio of oxygen to hydrogen of between 0.5–2.0:1.

9. The method of claim 1 wherein the BSG layer is annealed at a temperature between 700–1100° C. for between 10 and 120 minutes.

10. The method of claim 1 wherein the upper portion of the BSG layer is removed by exposing the layer to a fluorine-containing agent.

11. The method of claim 10 wherein the fluorine-containing agent comprises a liquid solution.

12. The method of claim 10 wherein the fluorine-containing agent comprises dissociated fluorine species formed by a plasma.

13. The method of claim 1 wherein the USG layer is deposited by a high density plasma process that has simultaneously deposition and sputtering components.

14. A method of filling a gap formed between adjacent raised surfaces on a substrate, the method comprising:
   depositing a boron-doped silica glass (BSG) layer over the substrate to partially fill the gap by using a thermal CVD process and a processing chamber pressure of between 100 and 700 Torr, wherein the BSG layer has a Eutectic temperature;
   exposing the BSG layer to a steam ambient at a temperature above the Eutectic temperature;
   removing an upper portion of the BSG layer by exposing the layer to a fluorine-containing etchant; and
   depositing an undoped silica glass (USG) layer over the BSG layer to fill the remainder of the gap.

15. The method of claim 14 wherein the USG layer is deposited by a high density plasma process that has simultaneously deposition and sputtering components.

16. The method of claim 15 wherein the BSG layer is heated above its glass transition temperature in a steam ambient having a ratio of oxygen to hydrogen of between 0.5–2.0:1.

17. The method of claim 16 wherein the gap is a trench in a shallow trench isolation (STI) structure.

* * * * *